United States Patent [19]

Teichmann et al.

[11] Patent Number: 4,857,233
[45] Date of Patent: Aug. 15, 1989

[54] NICKEL PARTICLE PLATING SYSTEM

[75] Inventors: Robert J. Teichmann, Belleville; James F. Walther, Mountain Lakes; Mulhall Robert C., Verona, all of N.J.

[73] Assignee: Potters Industries, Inc., Carlstadt, N.J.

[21] Appl. No.: 199,196

[22] Filed: May 26, 1988

[51] Int. Cl.⁴ .................... H01B 1/16; H01B 1/22
[52] U.S. Cl. .................... 252/513; 252/512; 252/514; 428/570
[58] Field of Search .......... 252/512, 513, 514; 428/570

[56] References Cited

U.S. PATENT DOCUMENTS

| | | | |
|---|---|---|---|
| 2,018,343 | 10/1935 | Bienfait et al. | 252/514 |
| 2,038,521 | 4/1936 | Vogt | 342/423 |
| 2,470,352 | 5/1949 | Holmes | 252/514 |
| 2,771,380 | 11/1956 | Coleman et al. | 427/125 |
| 3,031,344 | 4/1962 | Sher et al. | 428/551 |
| 3,140,342 | 7/1964 | Ehrreich et al. | 252/512 |
| 3,194,860 | 7/1965 | Ehrreich et al. | 252/511 |
| 3,202,488 | 8/1965 | Ehrreich et al. | 252/514 |
| 3,310,718 | 3/1967 | Lupfer | 252/514 |
| 3,326,700 | 6/1967 | Zeblisky | 427/305 |
| 3,329,512 | 7/1967 | Shipley, Jr. et al. | 427/404 |
| 3,361,580 | 1/1968 | Schneble, Jr. et al. | 427/306 |
| 3,476,530 | 11/1969 | Enrreich et al. | 252/512 |
| 3,583,930 | 6/1971 | Ehrreich et al. | 252/514 |
| 3,718,594 | 2/1973 | Miller | 428/928 |
| 3,718,608 | 2/1983 | Mason et al. | 252/514 |
| 3,725,308 | 4/1973 | Ostolski | 252/514 |
| 3,957,694 | 5/1976 | Bolon et al. | 252/514 |
| 3,968,056 | 7/1976 | Bolon et al. | 252/514 |
| 3,988,651 | 10/1976 | Hertz | 428/680 |
| 4,088,801 | 5/1978 | Bolon et al. | 252/514 |
| 4,118,234 | 10/1978 | Jans | 427/305 |
| 4,450,188 | 5/1984 | Kawasumi | 252/514 |
| 4,711,814 | 12/1987 | Teichmann | 252/514 |
| 4,716,081 | 12/1987 | Ehrreich | 252/514 |

FOREIGN PATENT DOCUMENTS

| | | | |
|---|---|---|---|
| 710371 | 5/1965 | Canada . | |
| 107863 | 10/1983 | European Pat. Off. . | |
| 0005196 | 2/1973 | Japan | 252/514 |
| 0038196 | 3/1977 | Japan | 252/514 |
| 0045515 | 4/1981 | Japan | 252/512 |
| 0067659 | 4/1982 | Japan | 252/514 |
| 0113505 | 7/1982 | Japan | 252/512 |
| 0258279 | 12/1985 | Japan | 252/513 |
| 1179261 | 8/1986 | Japan | 252/514 |
| 3054472 | 3/1988 | Japan | 252/512 |
| 3090565 | 4/1988 | Japan | 252/512 |
| 0475664 | 9/1975 | U.S.S.R. | 252/513 |
| 1059523 | 2/1967 | United Kingdom | 252/513 |

OTHER PUBLICATIONS

"Electroless Copper Plating", *Modern Electroplating*, F. Lowenstein, 3d Edition, pp. 734–739.

*Primary Examiner*—L. DeWayne Rutledge
*Assistant Examiner*—David W. Schumaker
*Attorney, Agent, or Firm*—Lee C. Robinson, Jr.

[57] ABSTRACT

A nickel particle plating system in which a multiplicity of minute nickel spheres are provided with a heavy copper coating and then a comparatively thin silver coating. The copper coating is at least about 20 percent by weight of the shpere, and the silver coating has a maximum thickness of about 15 percent of the sphere diameter. The coated spheres are deposited in a nonconductive matrix to form an electroconductive body in which the spheres may be placed along conductive paths.

8 Claims, 1 Drawing Sheet

NICKEL PARTICLE PLATING SYSTEM

BACKGROUND OF THE INVENTION

This invention relates to particulate material and more particularly to electroconductive particles useful in an electroconductive body, and to a method for making the particles.

According to Teichmann U.S. Pat. No. 4,711,814, spherical particles of nickel or other magnetic material are provided with a coating of one or more noble metals for use in an electroconductive matrix or substrate. The particles exhibit improved resistance to migration and corrosion as well as substantially reduced contact resistance and other good electrical properties.

In many types of electroconductive bodies it is also important to provide particles which have the ability to readily dissipate heat generated by the current applied to the body or from other sources. The heat problems created by prior electroconductive bodies were of special moment in cases where the body was subjected to current of comparatively high amperage, and in some cases the resulting deleterious effect on the organic binder material for the particles seriously impaired the electrical conductivity of the body.

SUMMARY

One general object of the invention, therefore, is to provide a new and improved particulate material for use in electroconductive bodies.

Another object of the invention is to provide a novel method for making the particulate material.

More specifically, it is an object of the invention to provide such particulate material which exhibits extremely good heat dissipation properties.

Still another object of the invention is to provide a particulate material for an electro-magnetic conductive body in which the overall conductivity of the body is further improved.

A further object of the invention is to provide a new and improved method for making particulate material which is economical and thoroughly reliable in operation.

In one illustrative embodiment of the invention, there is provided a particulate material for an electroconductive body which comprises a multiplicity of nickel particles having an average particle size of from 10 to 500 microns in maximum dimension. A comparatively heavy deposition of copper is applied to each of the nickel particles in an amount sufficient to serve as a heat sink for the particles. The copper coating is surrounded by a coating of silver or other noble metal on each particle to prevent oxidation of the copper and to ensure the desired electrical conductivity.

In accordance with one feature of the invention, the copper coating on each particle is at least 20 percent and preferably at least 50 percent by weight of the coated particle. With this arrangement, the particles exhibit the ability to readily dissipate heat, and the overall electrical conductivity is further improved.

In accordance with another feature of the invention, in several particularly advantageous embodiments, the silver coating is applied uniformly around the copper coating with a maximum thickness of about 15 percent of the maximum particle dimension. The silver protects the copper from oxidation, and when the particles are assembled in an electroconductive body the body exhibits extremely low contact resistance.

The present invention, as well as further objects and features thereof, will be more fully understood from the following description of a preferred embodiment, when read with reference to the accompanying drawing.

DESCRIPTION OF A PREFERRED EMBODIMENT

Figure 1:
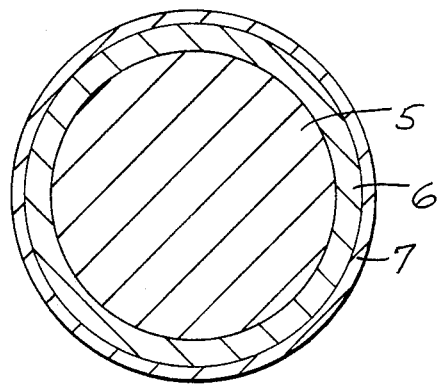
FIG. 1 is a substantially enlarged vertical sectional view of an electrically conductive particle in accordance with an illustrative embodiment of the invention.

Referring to FIG. 1 of the drawing, there is shown a magnetic electrically conductive solid particle 5 of commercially pure nickel which is provided with a copper coating 6 and a silver coating 7. In the illustrated embodiment the particle 5 advantageously is of beadlike spherical configuration, although in other embodiments the particles may be in the form of flakes, fibers or otherwise have irregular or other geometric shapes with good results. The particles 5 are extremely minute and are of a size, on average, of from 10 to 500 microns in maximum dimension.

Prior to the application of the copper coating 6 and the silver coating 7, the nickel particles 5 are thoroughly cleaned and catalized in a container of glass or other nonreactive material. The cleaning is performed through the use of a suitable dilute acid solution, the particles are rinsed with deionized water, and they are then catalized using a dilute precious metal in a hydrochloric acid solution. The particles are again rinsed with deionized water which has been purged with nitrogen, and this latter rinsing procedure is repeated two or three times to insure that any oxidation of the nickel is maintained at a minimum.

The coating 6 on the particle 5 preferably is commercially pure copper, although in some cases a brass or bronze coating may be employed with good effect. To provide the desired heat dissipation characteristics the copper on each particle should be at least 20 percent and preferably at least 50 percent by weight of the coated particle.

The copper coating 6 may be applied to the nickel particles 5 by an electroless plating technique, that is, a technique that does not rely on electrolysis. Conventional electroless plating techniques are described, for example, in Jans U.S. Pat. No. 4,118,234, Schneble U.S. Pat. No. 3,361,580, Shipley U.S. Pat. No. 3,329,512, Zeblisky U.S. Pat. No. 3,326,700, Ehrrich U.S. Pat. No. 3,476,530, Ehrrich U.S. Pat. No. 3,3202,488, Ostolski U.S. Pat. No. 3,725,308 and in the F. Lowenheim article entitled "Electroless Copper Plating" from *Modern Electroplating* (3d Edition). For many applications, however, the conventional techniques are not suitable primarily because of their very slow plating rates and because the plating rate tends to slow down or even stop prior to the time the desired high thickness of the copper coating is achieved.

The copper plating techniques of the present invention are not so limited. To form the copper coating 6 on the nickel particles 5 by electroless plating, the nickel particles are immersed in an electroless copper plating bath containing a source of copper ions, a complexing agent to keep the copper soluble at high pH, a reducing agent and one or more stabilizers in an amount substantially less than that considered necessary heretofore. The copper ions typically are obtained from an aqueous copper sulfate solution that is almost saturated to produce an autocatalytic reaction upon violent mixing. The amount of copper in the solution ranges from about 2 grams per liter to about 15 grams per liter. Although a variety of complexing agents may be used in the invention, a polydentate ligand such as ethylene diamine tetra-acetic acid or the ligand marketed under the trademark Quadrol provides unusually high plating rates and yet maintains optimum color characteristics. The molar ratio of the complexing agent to the copper should exceed 1:1 to form full copper complexes, and above about 6:1 molar ratios there is no appreciable benefit. For polyalcohols such as Quadrol or EDTA, the molar ratio should lie between 1.1:1 and 1.2:1 for best results. Hydroxides such as sodium hydroxide may be employed to maintain a high pH, and formaldehyde is a preferred reducing agent. The pH should exceed 10 and preferably should range from about 12.5 to about 13.00. The process is stabilized by adding sufficient stabilizer to prevent spontaneous decomposition and formation of copper fines and yet not enough to slow the rate of copper deposition. Typical stabilizers include sodium or other cyanides, organic nitriles, organic and inorganic sulfur compounds and various combinations of these stabilizers. The amount of stabilizer used in the process should be in the parts per million range and preferably from about 2 parts per million to about 10 parts per million for best results. The reaction is permitted to continue until the copper builds up on the nickel particles to produce a smooth and uniform coating on each particle.

An alternative electrodeposition technique for applying the copper coating 6 utilizes vibratory plating technology. A vibrating barrel-type device serves as a cathode and is immersed in the plating solution bath which contains the usual anodes. The barrel agitates the particles during the deposition process to provide a heavy and uniform copper coating particularly on the larger size nickel particles.

The silver coating 7, on the other hand, may be applied by numerous techniques known in the art. For example, the silver coating may be applied by immersion plating, by fluidization using dry or wet methods, by electroless plating, and the like. For a more detailed discussion of representative silver coating techniques that may be employed, reference is made to the above Teichmann U.S. Pat. No. 4,711,814 and the patents referred to therein.

To achieve full advantage of the lower electrical and thermal resistivity of copper as compared to nickel (1.7 vs. 7.0 micro ohms per cm.), the copper coating on each particle should be at least 20 percent and preferably at least 50 percent by weight of the coated particle, as indicated heretofore. To meet this criteria the thickness of the copper coating will of course depend on the size of the nickel particles, but for many embodiments the thickness of the copper should be between about 7.8 microns and about 61.0 microns. Except for extremely small nickel particles, below about 7.8 microns there is insufficient copper on each particle to provide the necessary conductivity and thermal characteristics, while if the thickness of the copper exceeds about 61.0 microns the size of the coated particles is too large for many applications.

The silver coating preferably ranges from about 0.1 percent to about 25 percent by weight of the coated particle, and the maximum thickness of the silver on each particle is about 15 percent of the maximum particle dimension. For particles of average size, the minimum thickness of the silver coating should be about 300 angstroms. The silver is highly conductive, and it provides good corrosion resistance and reduces oxidation of the copper.

In some embodiments a gold or other precious metal coating may be substituted for the silver coating 7. The gold coating ranges from about 0.5 percent to about 15 percent by weight of the coated particle, and it substantially reduces oxidation and hence enhances the corrosion resistance of the particle. The thickness of the gold coating should be at least about 200 angstroms. The coating is uniform and has a thickness which ranges from about 0.1 percent to about 5.0 percent of the diameter or other maximum dimension of the particle.

Figure 2:
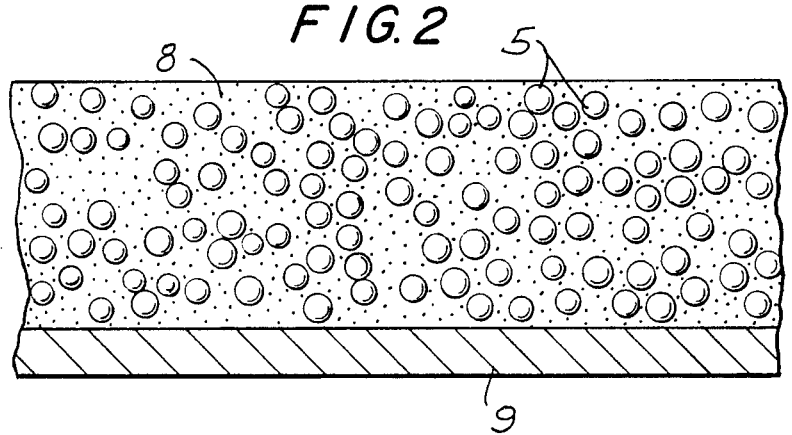
FIG. 2 is an enlarged fragmentary vertical sectional view of an electroconductive body incorporating the particles of FIG. 1.

FIG. 2 is illustrative of an electroconductive body in the form of a conductive paste. The paste comprises an organic vehicle 8, containing polyvinyl alcohol, for example, in which are suspended a multiplicity of the coated particles 5. Typically, the electroconductive body is deposited on and adheres to a substrate 9 of copper, mica, glass or other suitable material. The particles 5 are randomly oriented within the conductive paste but are in sufficient proximity with one another to allow the free passage of electrons. Some of the coated particles similarly are sufficiently close to the upper surface of the paste to allow free electron passage between the surface and the coatings on the particles, while other particles are sufficiently close to the substrate 9 to likewise allow free electron passage. Thus, a large number of conductive paths are established through the electroconductive body.

The silver-coated copper-coated nickel particles in accordance with the invention provide a conductive or semiconductive component for a wide variety of electrical devices. Such devices include, inter alia., conductive paste and coatings, conductive adhesives, and devices used for electromagnetic interference shielding.

For example, the silver and copper-coated particles may be incorporated in a methacrylate polymer to form a conductive paste. The particles are suspended in the paste in sufficient quantity so that electrons can pass freely between adjacent particles. The paste is applied to a metallic substrate such that the substrate may serve as a terminal or contact point for an electrical circuit.

The amount of particles suspended in the paste will depend in part on the thickness of the electroconductive coatings on the particles. Particularly in cases where the particles have a relatively low conductive metal content, however, the coated particles should constitute at least about 15 volume percent, and preferably about 40 volume percent, by weight of the paste.

The amount of conductive metal incorporated in the paste in the form of particle coatings is at least 2.0 percent and not more than 90.0 percent by weight of the paste. Particularly good results are achieved in situations in which the combined weight of the silver and copper in the particles constitutes at least about 15 percent by weight of the paste.

The conductive paste is made from an organic binder that serves as a nonconductive matrix and imparts to the paste the proper rheology, including an appropriate consistency for application on a substrate by screening, painting, dipping, etc. Typically, the binder contains one or more resins and one or more solvents to give the paste the desired consistency, but in some embodiments the solids are omitted. Illustrations of suitable substances include the low molecular weight aliphatic unsaturated organic polymers, or a mixture of an aliphatic unsaturated organic polymer and a copolymerizable aliphatic unsaturated organic monomer, such as styrene. Further examples include the low molecular weight polyamides such as those disclosed in Ravve U.S. Pat. No. 3,535,148, the low molecular weight polyesters such as those described in Fitko U.S. Pat. No. 3,567,494, acrylate esters and methacrylate esters of polyhydric alcohols, the various additional binder materials described in Abrams U.S. Pat. Nos. 4,419,279 and 4,496,475, elastomeric polymers such as silicones, rigid polymers such as polyolefins, styrenes, polyesters and polyamides.

The following examples are set forth in illustration of the invention and should not be construed as a limitation thereof. Unless otherwise indicated, all parts and percentages given are by weight.

EXAMPLE I

Thirty seven grams of spherical nickel particles having an average particle size of 60 microns were placed in a glass round bottom flask. A twenty percent sulfuric acid solution was added to the particles at a temperature of 60° C., and the particles were agitated within the flask for fifteen minutes. Following the agitation, the sulfuric acid was rinsed off with deionized water, and the thus cleaned nickel particles were activated with a 0.05 percent solution of palladium chloride in 10 percent hydrochloric acid for one minute.

The hydrochloric acid was rinsed off the particles with deionized water, and the particles were inserted in a copper plating bath having the following composition:
210 g copper sulfate pentahydrate
270 g Quadrol
170 g sodium hydroxide
0.03 g potassium cyanide
70 cc formalin
14 liters distilled water at 60° C.

During the plating process the bath was vigorously agitated, and a 20 percent sodium hydroxide solution and formalin were added to maintain the concentration of these ingredients at the starting level. When the copper was substantially depleted, the particles were rinsed with deionized water and were observed to have a uniform and complete copper coating on each particle. The copper comprised 57 percent by weight of the coated particle.

The copper coated nickel particles were then added to a silver plating bath containing 11 grams of silver cyanide, 44 grams of sodium cyanide and 1.6 liters of water at a temperature of 60° C. The bath was vigorously agitated for approximately 10 to 15 minutes, and the excess solution was decanted. The particles were then rinsed and dried. The resulting silver coated copper coated nickel particles were observed to have a smooth and uniform silver coating on the copper coating over the entire surface area of the particles. The particles contained 10 percent by weight silver, 50 percent by weight copper and the balance nickel.

EXAMPLE II

Fifty grams of spherical nickel particles having an average diameter of 60 microns were cleaned and activated in the manner described in Example I. The activated particles were then placed in the copper plating bath of Example I, and 2.75 liters of a copper replenishing solution were added to the bath with proportional amounts of sodium hydroxide and formaldehyde solution to maintain the copper, sodium hydroxide, formaldehyde and cyanide levels close to the starting composition. The copper replenisher was composed of 210 grams of $CuSO_4 \cdot 5H_2O$ and 20 grams Quadrol diluted to one liter with distilled water, and 20 percent sodium hydroxide with four ppm potassium cyanide. After rinsing with the deionized water, the copper coated nickel particles contained 79 percent by weight copper.

The copper coated nickel particles were then inserted in a silver plating bath containing 30 grams of silver cyanide, 120 grams of sodium cyanide and 4.5 liters of water at 60° C. The bath was agitated as described in Example I, and the silver coated copper coated particles were then removed from the bath, rinsed and dried. The particles were observed to contain 10 percent by weight silver, 70 percent by weight copper and the balance nickel.

EXAMPLE III

One hundred and ninety grams of spherical nickel particles having an average diameter of 150 microns were cleaned, activated and added to the copper bath as described in Example I. The bath was agitated more vigorously than in Example I to maintain the larger particles in suspension. The resulting copper coated nickel particles contained 21 percent copper by weight.

The copper coated nickel particles were then rinsed and silver plated in a bath containing 1.5 grams of silver cyanide, 6 grams of sodium cyanide and 0.22 liters of water at 60° C.

The particles were maintained under agitation in the bath under the conditions described in Example I, and they were then rinsed and dried. The resulting silver coated copper coated nickel particles contained 0.5 percent silver by weight, 20 percent copper by weight and the balance nickel.

EXAMPLE IV

Fifty grams of spherical nickel particles having an average diameter of 250 microns were cleaned as described in Example I and inserted into the vibratory barrel of an electrolytic copper plating bath. The composition of the bath was as follows:
19 g/l copper as copper sulfate
190 g/l sulfuric acid
60 ppm chloride as HCl
Brighteners The bath was operated at 1.5 amperes per square decimeter and produced a copper thickness on the nickel particles of approximately 16 to 20 microns per hour. The plating process was continued for 3.3 hours to provide copper coated nickel particles containing 70 percent by weight copper with a copper thickness of 60 microns. The copper coated nickel particles were then silver plated using the technique described in Example I.

Although the invention has been described and illustrated as having particular utility in the manufacture of silver coated copper coated spheres, particles of various other shapes may be produced thereby without departing from the spirit or scope of the appended claims. For example, nickel flakes, fibers or irregularly shaped nickel particles may be coated with copper and silver and imbedded in a suitable matrix in the manner described herein. The particles should contain sufficient nickel to provide a core material having optimum magnetic characteristics.

The terms and expressions which have been employed are used as terms of description and not of limitation, and there is no intention in the use of such terms and expressions of excluding an equivalents of the features shown and described, or portions thereof, it being recognized that various modifications are possible within the scope of the invention claimed.

What is claimed is:

1. A particulate material for an electroconductive body, the material comprising, in combination:
    a multiplicity of nickel particles having an average particle size of from 10 to 500 microns in maximum dimension;
    a copper-containing coating on each of the nickel particles, the copper-containing coating on each particle being at least about 20 percent by weight of the particle; and
    a coating of noble metal surrounding the copper coating on each particle and having a maximum thickness of about 15 percent of the maximum particle dimension.

2. A particulate material for an electroconductive body, the material comprising, in combination:
    a multiplicity of nickel particles having an average particle size of from 10 to 500 microns in maximum dimension;
    a copper-containing coating on each of the nickel particles, the copper-containing coating on each particle being at least about 20 percent by weight of the particle; and
    a silver coating surrounding the copper coating on each particle and having a maximum thickness of about 15 percent of the maximum particle dimension.

3. A particulate material as defined in claim 2, in which the silver coating on each particle is between about 0.1 percent and about 25 percent by weight of the particle.

4. A particulate material for an electroconductive body, the material comprising, in combination:
    a multiplicity of nickel particles having an average particle size of from 10 to 500 microns in maximum dimension;
    a copper coating on each of the nickel particles, the copper on each particle being at least about 50 percent by weight of the particle; and
    a silver coating surrounding the copper coating on each particle and having a maximum thickness of about 15 percent of the maximum particle dimension.

5. A particulate material as defined in claim 4, in which the minimum thickness of the silver coating on each particle is about 300 angstroms.

6. A particulate material as defined in claim 4 in which the thickness of the copper coating on each particle is between about 7.8 microns and about 61.0 microns.

7. An electroconductive body comprising, in combination:
    a nonconductive matrix;
    a multiplicity of nickel particles embedded in the matrix and having an average particle size of from 10 to 500 microns in maximum dimension;
    a copper coating on each of the nickel particles, the copper on each particle being at least about 50 percent by weight of the particle; and
    a silver coating surrounding the copper coating on each particle and having a maximum thickness of about 15 percent of the maximum particle dimension.

8. An electroconductive body as defined in claim 7, in which the coated particles embedded in the matrix constitute at least about 15 percent by weight of the matrix.

* * * * *